United States Patent [19]

Sherman

[11] Patent Number: 4,510,454
[45] Date of Patent: Apr. 9, 1985

[54] APPARATUS FOR DIGITALLY CONTROLLED CALIBRATION OF FREQUENCY RESPONSE OF AMPLIFIERS

[75] Inventor: David M. Sherman, Everett, Wash.

[73] Assignee: John Fluke Mfg. Co., Inc., Everett, Wash.

[21] Appl. No.: 551,713

[22] Filed: Nov. 14, 1983

[51] Int. Cl.³ .................................. G01R 23/00
[52] U.S. Cl. .................................. 330/2; 328/167
[58] Field of Search ............... 330/2, 144, 145, 302; 307/520; 328/167

[56] References Cited

U.S. PATENT DOCUMENTS 4,392,068  7/1983  Welles, II .............. 307/520 X

FOREIGN PATENT DOCUMENTS 2112200  11/1971  Fed. Rep. of Germany ...... 307/520

Primary Examiner—James B. Mullins
Assistant Examiner—Steven J. Mottola
Attorney, Agent, or Firm—Mikio Ishimaru; Stephen A. Becker

[57] ABSTRACT

A system for tailoring the frequency response of the amplifier of an AC volt meter during calibration, comprising an adjustable filter consisting of a primary resistor and a number of differently valued capacitors connected together through a corresponding number of switches within an array. During a calibration mode, a test voltage is applied to the input of the amplifier, and the microprocessor switches different values of the capacitors in circuit with the amplifier. The combination of capacitors that causes the frequency response of the amplifier to match most closely with a predetermined response is selected for calibration.

5 Claims, 4 Drawing Figures

APPARATUS FOR DIGITALLY CONTROLLED CALIBRATION OF FREQUENCY RESPONSE OF AMPLIFIERS

FIELD OF THE INVENTION

The present invention relates generally to circuitry for adjusting the frequency response of an AC amplifier and more particularly to circuitry for digitally controlling the calibration of an AC voltmeter.

BACKGROUND OF THE INVENTION

In the past, there were three systems used for controlling the calibration of frequency response of AC amplifiers in precision instruments.

The first method used low cost commercial components which included variable capacitors, resistors, and/or inductors. These instruments were generally calibrated only in the factory by skilled technicians very carefully adjusting component values to the required degree of precision. In a typical high precision instrument, there are at least as many high frequency calibration points as there are ranges. Thus, a tremendous number of adjustments were required which meant that a precision instrument was and still is very expensive in terms of the skilled manpower required to produce it.

Further, mechanical disturbances in the factory from putting on and taking off the instrument's protective covers would often result in shifts of the precision settings. In the field, unless extreme care were taken to avoid subjecting the precision instrument to vibration or shock, the settings would also shift and require the instruments to be recalibrated.

The second method, which eliminated the need for manual adjustments, was to use extremely high precision components in matched sets or selectively choosing parts having the precise values required. Unfortunately, the matching or selecting process resulted in extremely expensive parts. Further, if one of a matched set of components failed, the entire matched set would have to be replaced and the instrument again recalibrated to the desired frequency response.

The third method, which is used by a few highly skilled companies in the industry, is to build the circuitry as a hybrid or thin film circuit and using an active laser or abrasive trimming of the circuit to obtain the necessary values. This method naturally requires a high degree of technological sophistication to produce the basic circuits as well as the expenditure of capital to purchase the expensive laser or precision abrasive trimming equipment.

Heretofore, it has not been possible to perform all calibration of frequency response using computer controlled automatic test equipment. This equipment would require no skilled labor or special training to operate, and could allow calibration to be performed relatively quickly. There has been no method by which in sitsu calibration could be performed so all previous methods required calibration prior to putting on the final shields, covers or guards on the instrument.

Further, no method has been developed which would allow the use of low cost commercial components without requiring expensive manual adjustment or machining equipment.

SUMMARY

The present invention provides a circuit for improving the frequency response of an A/C amplifier without manual adjustments, precision components or manufacturing process trimming.

The present invention further provides a frequency response adjusting system for A/C amplifiers which may be calibrated in sitsu with all guards, covers or shields in place on the precision instrument.

The present invention further provides a digitally controlled calibration of frequency response which can be done by computer controlled automatic test equipment which requires no skilled labor or special technical training to operate and which can be done relatively quickly.

The above and additional advantages of the present invention will become apparent to those skilled in the art from a reading of the following detailed description when taken in conjunction with the accompanying drawings.

DESCRIPTION OF THE PREFERRED EMBODIMENTS

Figure 1:
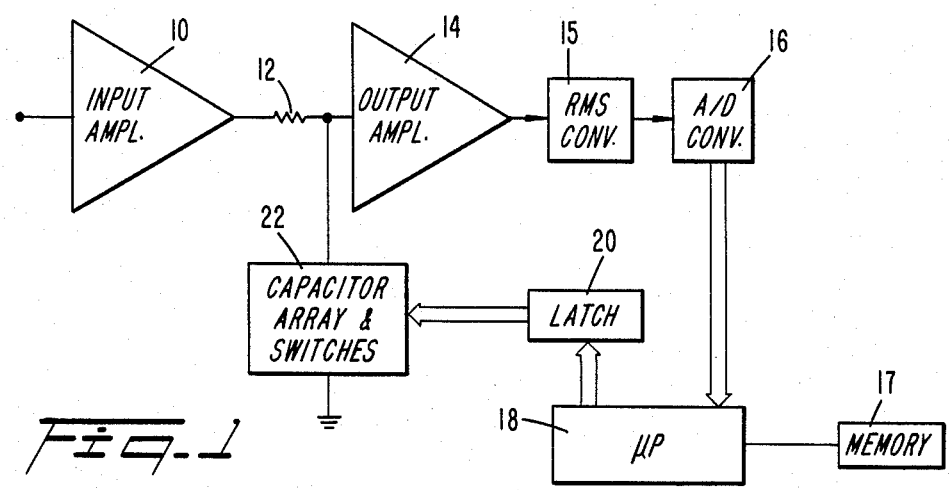
FIG. 1 is a block diagram of the circuit embodying the current invention.

Referring now to FIG. 1, therein is shown an input amplifier 10 which has a variable gain. The output of the input amplifier 10 is connected to a resistor 12 which is followed by an output amplifier 14. The output amplifier 14 is connected to a conventional, commercially available RMS converter 15 which in turn is connected to a conventional, commercially available analog to digital converter 16.

Figure 3:
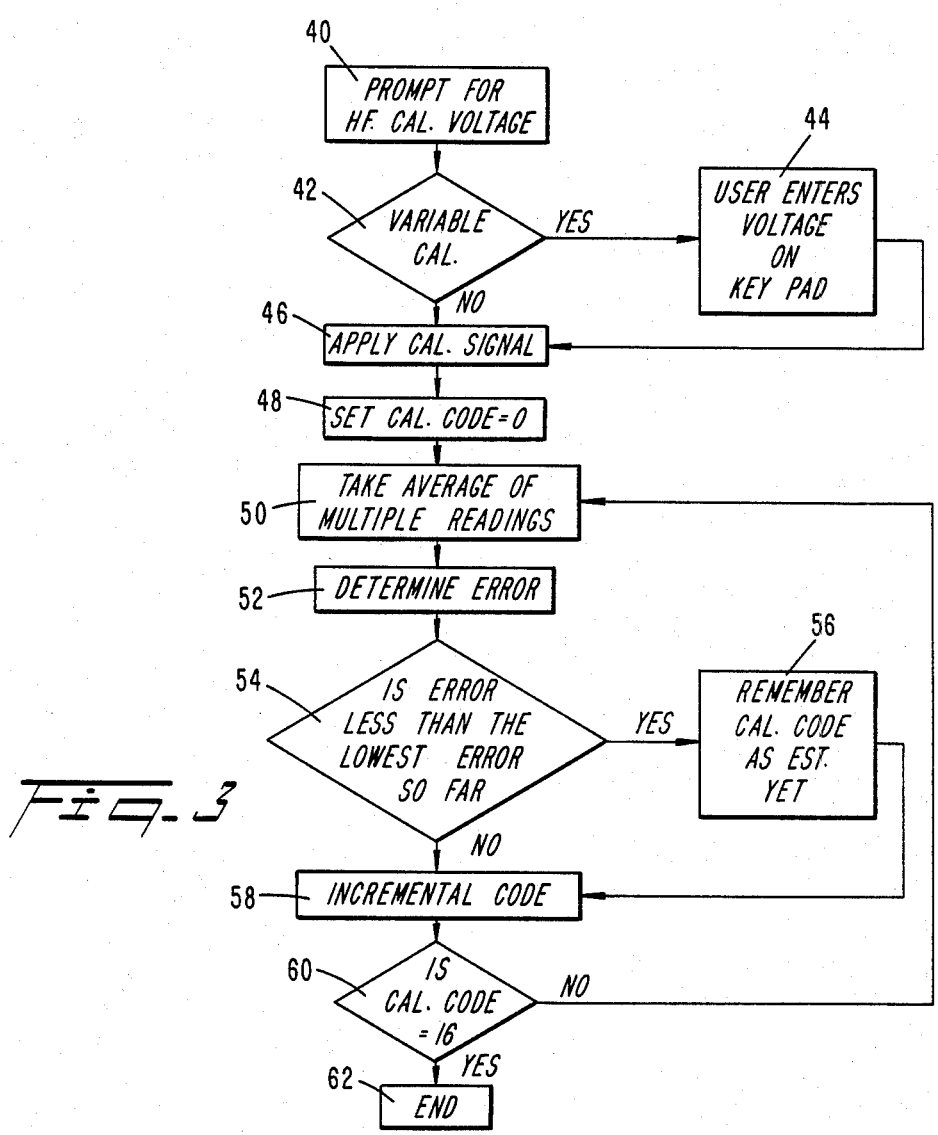
FIG. 3 is a flowchart of the control program of the present invention.

The output of the analog to digital converter 16 may be used for a number of other purposes not related to the current invention, but, in the present invention, it is sensed by a conventional, commercially available microprocessor 18. The microprocessor 18 may be any microcomputer which is capable of carrying out the software commands which will be later described and which are shown in FIG. 3. The microprocessor 18 has a conventional non-volatile memory 19 and is connected to drive a conventional latch circuit 20 which controls and holds the switches in a capacitor and switch array 22. The capacitor and switch array 22 is connected to the junction between the resistor 12 and the output amplifier 14 to form an RC low pass filter as will later be described.

Figure 2:
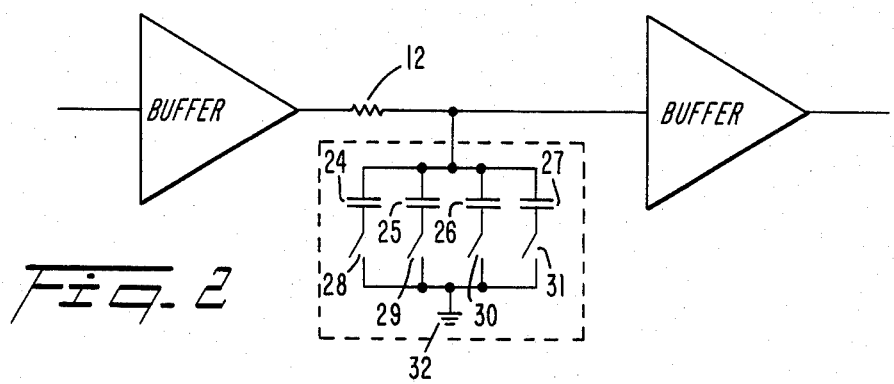
FIG. 2 is a schematic of a portion of the present invention shown in FIG. 1.

Referring now to FIG. 2, therein is shown a detailed schematic of the capacitor and switch array 22 as it is connected between the resistor 12 and the output amplifier 14.

The capacitor and switch array 22 includes a plurality of different value capacitors generally designated as capacitors 24, 25, 26, and 27 and a plurality of switches 28, 29, 30, and 31 which are each respectively connected to one of the capacitors and which are all grounded at the other end to a ground 32. In the preferred embodiment, four switches and capacitors are shown but those skilled in the art would appreciate that greater or lesser numbers would be desirable based on the particular degree of frequency response adjustment desired.

In operation, the input to the input amplifier 10 is an analog voltage being measured. The input amplifier 10 has a variable gain or attenuation depending on which of a multiple series of ranges has been selected. For purposes of the invention, there are numerous ways of varying the gain or attenuation. The resistor 12 and the capacitor and switch array 22 form a variable low pass filter. The output of the filter is buffered by the output amplifier 14 and then is fed into the RMS converter 15. The RMS converter 15 takes the AC input and produces a DC output proportional to its true RMS value which is provided to the analog to digital converter 16. The analog to digital converter 16 converts the DC signal into digital signals which are capable of being read by the microprocessor 18.

The microprocessor 18 sends a digital code to the latch circuit 20 where it turns switches on or off in the capacitor and switch array 22. The digital code (or on and off combinations of the switches) held in the latch is a multi bit word which is used to operate on an array consisting of four switches in series with four capacitors. The resistor 12 and the capacitors in the capacitor and switch array 22 form an RC low pass filter whose cutoff frequency may be set to any of $2^N$ values, where N is the number of switches; here four.

The configuration of the capacitor and switch array 22 is such that any or all of the four capacitors may be placed in parallel at any time producing an effective capacitance for the capacitor and switch array 22 which may have 16 different values. This allows the cutoff frequency of the RC low pass filter formed by the effective combination of the capacitors 24 through 27 and resistor 12 to be set to 16 different values.

The microprocessor 18 may be in either of two different modes depending upon whether the instrument is being calibrated or is in normal operation as will be described with reference to FIG. 3.

Initially, the operator indicates to the microprocessor 18 that a calibration is to be performed and then the operator selects the range or function which is to be calibrated. It should be noted that none of the operation inputs require any degree of technical expertise and so a computer may be tied into a calibrator to provide the calibration input to the input amplifier 10 and activate commands microprocessor 18 to run the entire test.

If a high frequency AC calibration is to be performed, the instrument (not shown) prompts the user at block 40 to enter into the microprocessor 18 the nominal high frequency AC calibration voltage. This voltage is one half of full scale for each range. The program then proceeds to the decision block 42 where the operator may decide whether to calibrate at a different voltage. If the operator decides not to calibrate at a different voltage; i.e. use a variable calibration, the program proceeds to the "apply calibration signal" block 46 while the operator applies a known value calibration signal from a separate commercially available calibrator (not shown) at a frequency of 100 khz. Where a variable calibration is to be performed, the operator must manually enter the voltage figure which will be actually applied to the input amplifier 10 into the microprocessor 18 prior to proceeding to the block 46 where the actual calibration signal is applied.

At this point the microprocessor 18 begins a loop in which it tests every one of the 16 (in the preferred embodiment) possible high frequency calibration code until it finds the one which gives a reading closest to the input.

The test is accomplished by having the program next proceed to the "set cal code" block 48 where the number of iterations of the calibration code is set to zero, and then the program proceeds to the average block 50 where a predetermined number of input readings are taken and averaged. The program then proceeds to block 52 where the difference or error between the average of the several input readings and the actual input value indicated by the operator is determined.

In the decision block 54, the error determined in the previous step is compared with the lowest error found during previous loops of the program. If this error is less than the earlier errors, it proceeds to the "remembered cal code" block 56 where the lowest error high frequency calibration code is stored in ROM in the microprocessor 18. If the current error is more than the previous error, or if the present error is the best value, the program proceeds to the "increment" block 58 where the number of iterations of the calibration code is incremented by one.

After the calibration code is incremented, the program goes to decision block 60 where it is determined if the new calibration code iteration is less than 16. If not, all the combinations or codes have not yet been tried so the program will return to the average reading block 50 to another cycle. If the new value is equal to 16 which indicates that every possible code has been tried, then the program will exit at block 62 and the code which gave the best possible frequency response saved in non-volatile memory 19 for future reference.

In the preferred embodiment, all 16 codes are tried because doing so does no require a significant amount of time. However, if greater resolution calibration were required, implying more switches and therefore much more time to try all possible codes, a binary sort technique would be added.

During normal operation, whenever the range is changed, the microprocessor 18 will look up the appropriate calibration code in the memory 19 and set the switches 28 through 31 to the proper on or off position to provide the best possible frequency response for that particular range.

Figure 4:
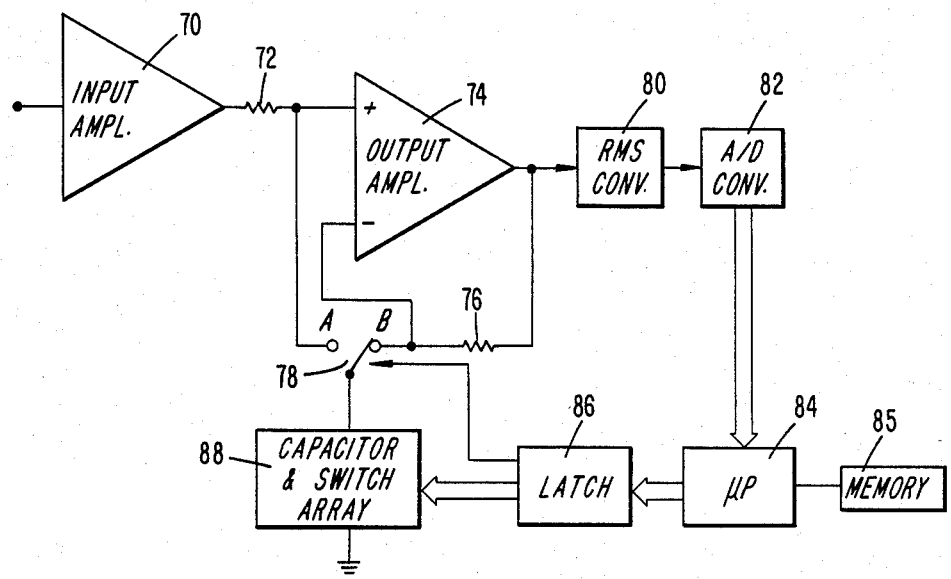
FIG. 4 is a block diagram of an alternate embodiment of the present invention.
Figure 4:
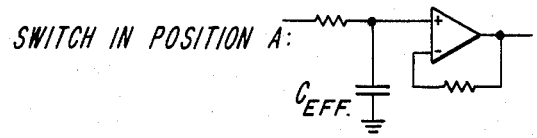
Figure 4:
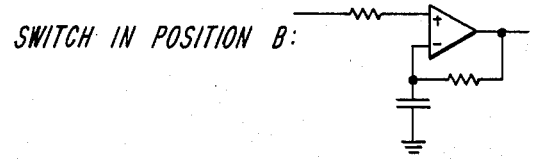

Referring now to FIG. 4, therein is shown an alternate embodiment which has the advantage that the output at high frequencies may be either greater or less than the input. The preferred embodiment only allows the output to be less than the input.

The circuit consists of an input amplifier 70 connected to a resistor 72 which is connected to an output amplifier 74. The output amplifier 74 is bridged by a feedback resistor 76 which is connected to a switch 78 which is also connected between the resistors 72 and the output amplifier 74. The output of the output amplifier 74 is connected to a conventional, commercially available RMS converter 80 which in turn is connected to a conventional, commercially available analog to digital converter 82.

The output of the analog to digital converter 82 is sensed by a microprocessor 84 which has a non-volatile memory 85 and which controls a latch circuit 86 which controls and holds the switches in a capacitor and switch array 88 which is identical to the capacitor and switch array designated as 22 and shown in FIG. 2. The latch circuit 86 further controls the switch 78 to selectively connect the capacitor and switch array 88 to the resistor 72 or the feedback resistor 76.

In operation, the alternate embodiment takes an input through the input amplifier 70 and amplifies it or attenuates it depending on which range is selected. The output from the input amplifier 70 may be increased or decreased at a high frequency depending on which position the switch 78 is set. If the switch 78 is connected to resistor 72, the output will be lower at higher frequencies than at low frequencies, as in the preferred embodiment. If the switch 78 is connected to the resistor 76, the output will be greater at high frequencies than at low frequencies.

The output from the output amplifier 74 is fed to the RMS converter 80 which takes the AC input and produces a DC output proportional to the true RMS value of the input signal. As in the preferred embodiment, this output is sensed by the analog to digital converter 82 and converted into digital codes which may be read by the microprocessor 84. The microprocessor 84 sends the codes to latch circuit 86 which adjusts the degree of high frequency peaking or rolloff desired as well as determining whether the circuit operates in a high frequency peaking or rolloff mode. The switch 78 is connected to be controlled by the most significant bit of the four bit digital word which controls the high frequency calibration.

As many possible embodiments may be made of the invention without departing from the scope thereof, it is to be understood that all matters set forth herein are shown in the accompanying drawings as to be interpreted in an illustrative and not a limiting sense.

I claim:

1. An apparatus for calibrating the frequency response of a system, comprising:
   means for receiving an input signal;
   amplifier means;
   means for measuring an output signal developed by said amplifier means;
   adjustable filter means composed of components that are selectively interconnectable to have a variable frequency response; and
   microprocessor means responsive to said measuring means for controlling said adjustable filter means to have a predetermined, ideal frequency characteristic of the system, said microprocessor means including memory means for storing a value of the ideal frequency response of said system, means for reading the present frequency response of the system from said output measuring means and control output means for modifying the frequency response of said filter means to approach the ideal frequency response.

2. The apparatus of claim 1, wherein said filter means includes a plurality of differently valued capacitors and switching means for selectively connecting predetermined ones of said capacitors in parallel with each other, and said microprocessor control output means includes means for selectively closing said switching means.

3. The apparatus of claim 2, including a primary resistor means connected in circuit with said capacitors.

4. An apparatus for calibrating the frequency response of a system, comprising:
   means for receiving an input signal;
   amplifier means;
   means for measuring an output signal developed by said amplifier means;
   adjustable filter means composed of components that are selectively interconnectable to have a variable frequency response; and
   microprocessor means responsive to said measuring means for controlling said adjustable filter means, said microprocessor means including memory means for storing a value of an ideal frequency response of said system, means for reading the present frequency response of the system from said output measuring means and control output means for modifying the frequency response of said filter means;
   wherein said microprocessor means includes means for storing frequency responses of said system measured by said output measuring means, means for determining which combination of said capacitors provides a measured frequency response of said system that is closest to a desired frequency response, and means for storing a code representing said combination.

5. The apparatus of claim 1, wherein said microprocessor means further includes means for selectively amplifying or attenuating signals at an output of said filter means.

* * * * *